United States Patent [19]

Filipov et al.

[11] 4,204,198
[45] May 20, 1980

[54] RADAR ANALOG TO DIGITAL CONVERTER

[75] Inventors: Andree N. Filipov, Silver Spring; Richard N. Johnson, Gaithersburg; Christopher N. Winslow, Baltimore, all of Md.

[73] Assignee: The United States of America as represented by the Secretary of the Army, Washington, D.C.

[21] Appl. No.: 862,319

[22] Filed: Dec. 20, 1977

[51] Int. Cl.² .......................................... H03K 13/02
[52] U.S. Cl. .......................................... 340/347 AD
[58] Field of Search ................... 340/347 AD, 347 M; 325/38 B; 332/11 D

[56] References Cited

U.S. PATENT DOCUMENTS

| | | | |
|---|---|---|---|
| 3,493,958 | 2/1970 | Gorbatemko | 340/347 AD |
| 3,646,586 | 2/1972 | Kurz | 340/347 AD |
| 3,648,248 | 3/1972 | Deman | 340/347 AD |
| 3,652,957 | 3/1972 | Goodman | 325/38 B |
| 3,839,675 | 10/1974 | Wernikoff | 332/11 D |
| 3,882,426 | 5/1975 | Hoeschele | 325/38 B |
| 3,913,016 | 10/1975 | Candy | 325/38 B |
| 3,956,746 | 5/1976 | Lisle | 340/347 AD |
| 4,028,534 | 6/1977 | Tucker | 340/347 AD |

*Primary Examiner*—Charles D. Miller
*Attorney, Agent, or Firm*—Nathan Edelberg; Robert P. Gibson; Saul Elbaum

[57] ABSTRACT

An analog-to-digital converter is disclosed providing high speed operation for high resolution analog signal data. The converter utilizes the repetitive nature of the data by converting a portion of the signal corresponding to the changing component of the data. A smaller number of bits of information is thus converted from analog-to-digital form than is needed to represent the data. In addition to savings in hardware, a significant saving in conversion time is provided. The cancellation of static components of a radar signal moreover provides, within the system, a clutter-free signal.

2 Claims, 5 Drawing Figures

RADAR ANALOG TO DIGITAL CONVERTER

RIGHTS OF THE GOVERNMENT

The invention described herein may be manufactured, used, and licensed by or for the United States Government for governmental purposes without the payment to us of any royalty thereon.

BACKGROUND OF THE INVENTION

1. Field of the Invention

The present invention relates to devices for conversion of analog signals to digital form. More specifically, an analog-to-digital converter is disclosed which converts a lesser number of bits than is used to represent the data being converted. Still more specifically, the invention relates to an analog-to-digital converter operating only upon the change in analog data occurring between predetermined time intervals.

2. BRIEF DESCRIPTION OF THE PRIOR ART

Prior art devices have been available which provide 10-bit conversion from analog signals, as provided by a radar system, for example, to digital signals, operating at approximately 10 megahertz. However, a need exists for a 12-bit converter. The present invention provides such a converter at a substantial savings in cost over the presently available analog-to-digital converters (ADC's). In operation, the present analog-to-digital converter provides for an updating of a particular value stored in a memory in order to minimize conversion time and to provide for a larger bit handling capability than the components themselves are capable of handling. One advantage of the present embodiment is the availability of clutter-free video signals at the output of the A-to-D converter. Prior art devices do not have this capability.

SUMMARY OF THE INVENTION

The present invention overcomes the disadvantages of the prior art by providing a high resolution, high speed analog-to-digital converter, operating at speeds available to lower resolution, or accuracy, devices.

The present invention provides conversion of a smaller number of bits than needed to represent the data being examined, such as a return radar pulse, for example. The conversion capability of the device is chosen to equal the expected rate of change of the observed data, thus providing for faster conversion than is attainable by conversion of the full data value.

Accordingly, it is a primary object of the present invention to provide an improved analog-to-digital converter.

It is a further object to provide an analog-to-digital converter operating at increased conversion rates.

It is a more specific object to provide analog-to-digital converters having operating speeds in excess of speeds available for full conversion of the analog data being observed.

It is yet another object to provide analog-to-digital converters which convert the changes in the observed analog data.

Yet another object is the provision of a converted analog signal by the addition of a stored digital value to a converted value representing the change in the observed analog signal.

An additional object is the provision of a fast analog-to-digital converter by the utilization of memory segmenting techniques.

Yet another object is the provision of an analog-to-digital converter, operating in conjunction with a radar system, providing clutter-free video signal output.

These and other advantages and objects of the present invention will become apparent to those skilled in the art upon reading the specification in conjunction with the drawings.

DETAILED DESCRIPTION OF A PREFERRED EMBODIMENT

The present invention originates in a need for a high speed analog-to-digital conversion apparatus for use in a radar system. Specifically, a 12-bit converter is needed for operation at a frequency of 10 megahertz.

The principles of this invention are applicable to converters for any number of bits operating at any frequency. The illustrative examples of 12-bit conversion at a 10 MHz rate are examples only, and not meant to limit the invention thereto. The scope of the invention is determined by the appended claims, and not by the presently preferred embodiment.

To provide the desired operating speed, a smaller number of bits is converted, corresponding to the rate of change of scanned data, rather than to the data itself. Thus, when 12-bit data is expected to change at a rate no faster than approximately four bits, for example, the present apparatus provides analog-to-digital conversion of a four-bit number with an output resolution of 12 bits. If the data change rate exceeds four bits, then a higher capacity converter needs to be used in the main path of the present invention. In general, the present system uses ADC capability commensurate with the rate of change of the analog data, rather than with the data itself.

Figure 5:
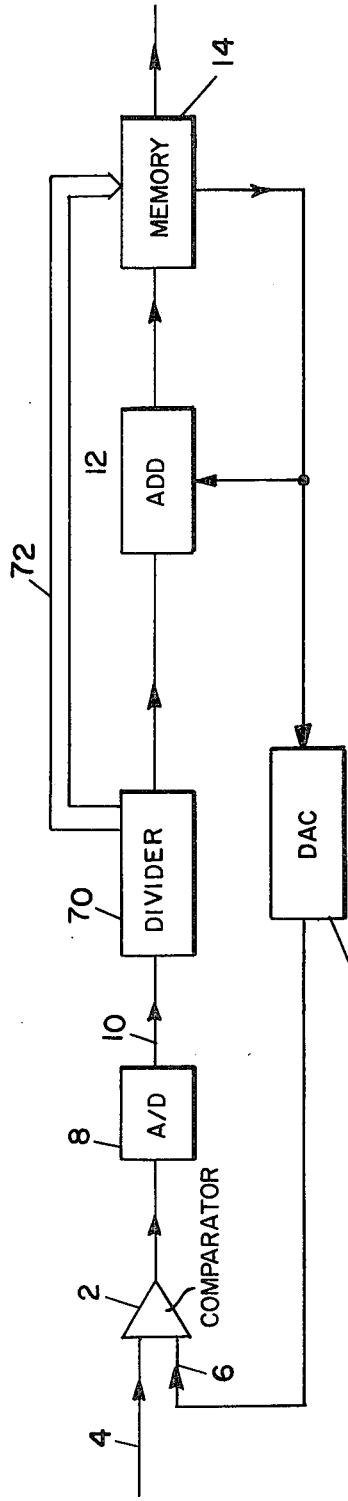
FIG. 5 is an alternate embodiment of the circuit of FIG. 1.

In an alternate embodiment shown in FIG. 5, a divider is advantageously included in the circuit to receive the output of the analog-to-digital converter and to shift the converted data by a predetermined number of bits. Upon shifting, the bits representing the least significant data change are apparently lost. However, those bits may be appended directly to the data representation stored in the memory, and the combination provides a complete data description for the point being examined. In this approach, the bits remaining after the shift, which represent the more significant bits of the data change, are added to the previous data stored in the memory, while the least significant bits are merely appended to the stored data when needed for observation, computation, etc.

Figure 1:
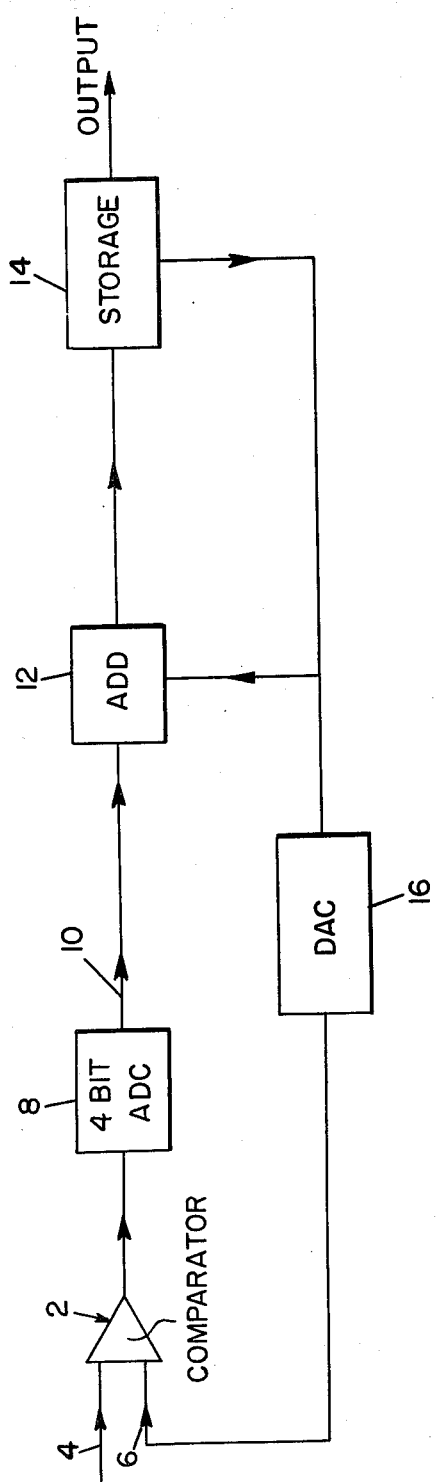
FIG. 1 is a block diagram of the invention.

Referring to FIG. 1, a comparator 2 receives an input signal on lead 4 representing the particular datum to be observed. A second input to the comparator, on lead 6, represents past data for that same point. The output of comparator 2 is converted by an analog-to-digital (A/D) converter 8 to a K-bit output number on lead 10.

The data may be serial or parallel. The K-bit number is added in an adder 12 to the past value of the datum representing the specific point, as obtained from a memory 14. Generally, the past data, after being updated by adder 12, are then restored in memory 14 as the present values of the data. The particular datum representing the present value for the specific point of interest is provided by storage 14 to a digital-to-analog converter (DAC) 16 for conversion back to an analog value for comparison in comparator 2 with the next analog input signal on lead 4.

Figure 2:
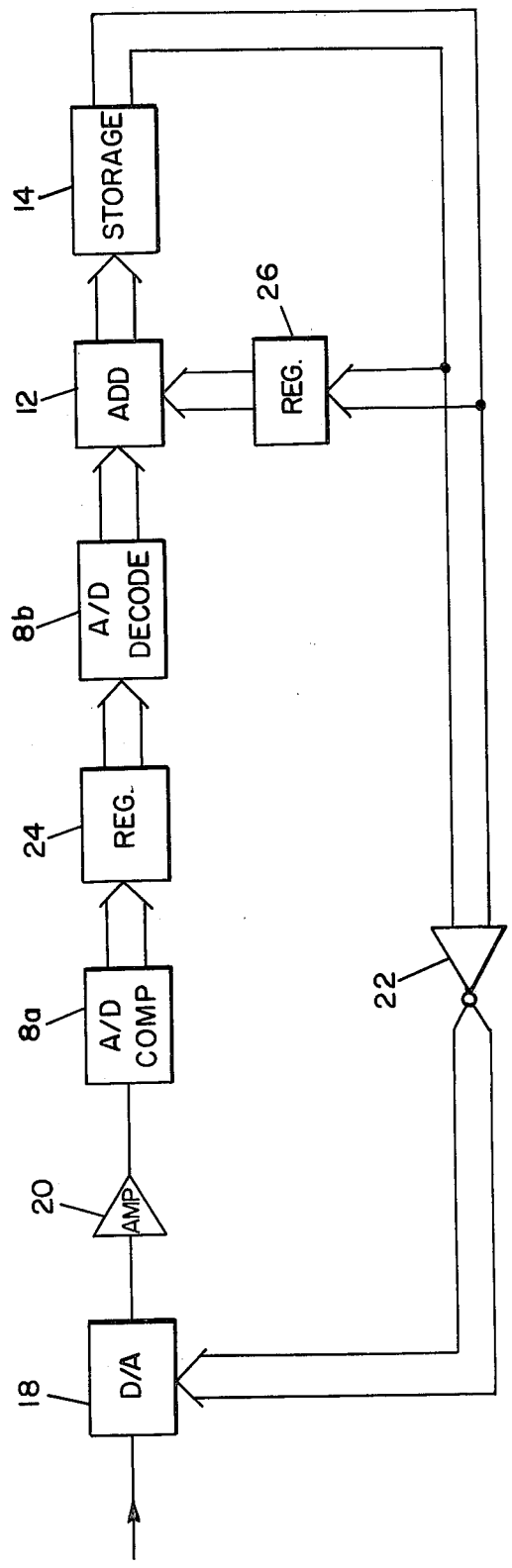
FIG. 2 is a modification of FIG. 1.

FIG. 2 represents a more detailed description of the elements in FIG. 1. Specifically, the DAC 18 includes therein a comparator, as is available from Computer Labs under the designation MDV-1240, for example. Converter 18 performs the functions of comparator 2 and converter 16 of FIG. 1. An amplifier 20 receives the output from converter 18, in order to raise the voltage value to a satisfactory operating level. The amplification effectively replaces amplification originally available in comparator 2. Inverter 22 represents inversion of each of the parallel data lines coming into the adding converter 18 presently contemplated for use. Of course, where converter 18 has subtracting capability, inverter 22 is unnecessary. As a result of the inversion, the required subtraction of signals contemplated in comparator 2 is achieved by converter 18.

A/D converter 8 is shown as a set of two separate devices, specifically comparators 8a and decoders 8b, separated by a register 24. The two components of converter 8 are used in order to speed the processing of the signals as they are received. Specifically, as converter 18 receives a particular digital signal from memory 14, and compares the same with the input analog signal, an output signal is immediately converted by A/D converter 8a. The resulting digital signal is then stored in register 24, for subsequent processing, thereby freeing the converter 18 to receive an additional input and additional data from the memory. Adder 12 receives a 12-bit addend from a delay register 26, which provides storage for the number from memory 14. The adder similarly receives a four-bit number from register 24 through decoder 8b, in which the sign bit is extended through the most significant bits, thus providing the augend for the addition computation therein. The resultant sum is then provided back to memory 14. Decoder 8b converts the 16 output lines from the comparators to a four-bit number representing the two's complement value of the output of the A/D comparator 8a.

A/D register 24 and delay register 26 store intermediate results, as well as allow for pipeline synchronization of the inventive converter. Thus, two separate values, one from the memory and the other representing update information, are brought, via registers 24 and 26, to adder 12 for conversion of the memory value.

Figure 3:
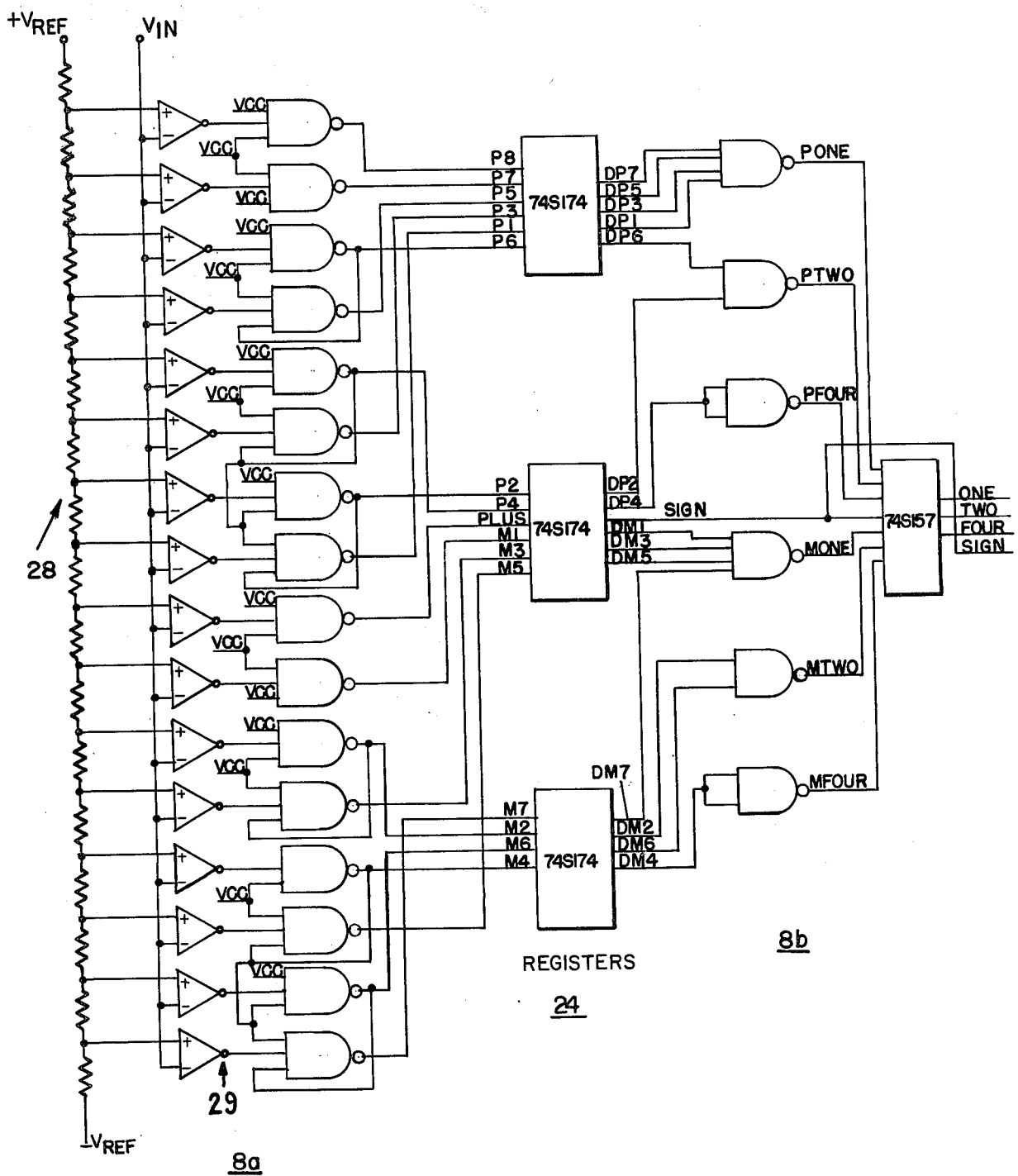
FIG. 3 is a detailed circuit diagram for a portion of FIG. 2.

FIG. 3 shows in greater detail the comparator 8a, decoder 8b, registers 24, and the interconnecting wiring thereof. Specifically, in converter 8a a resistive ladder network 28 is used to provide reference voltage values for several comparators in the circuit, shown at 29. This design of converter 8a is similar in concept to that found in Signetics Digital Linear MOS Applications, published by Signetics Corporation, copyright 1974. Specifically, the similarity is to the design found in FIG. 6 on page 6-69 of the publication. The published Signetics design contemplates an output of a three-bit unsigned number. The present requirement for a four-bit signed number is met by utilizing a combination incorporating, effectively, two three-bit designs and a sign bit. The converted deviation is generated as a three-bit digital number, representing the magnitude of the deviation, and a sign bit, representing its direction. The sign bit determines which output values of the Signetics 74S157 are provided at the output: the bits generated by the positive or by the negative deviation section.

Figure 4:
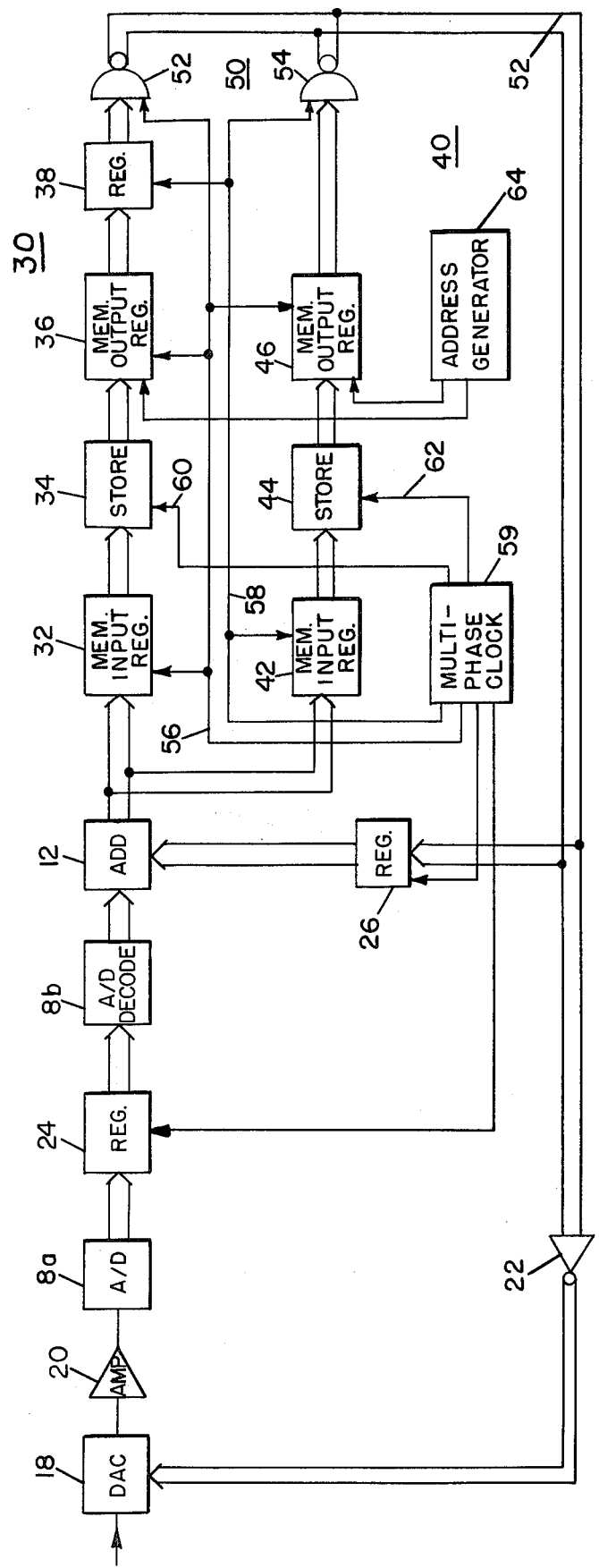
FIG. 4 is a block diagram showing FIG. 2 in yet more detail.

FIG. 4 is similar to FIG. 2, but with a more detailed disclosure of the memory section 14. Specifically, as shown in the figure, the memory is segmented into two portions in order to speed up operations. More particularly, a first portion 30 includes an input memory register 32, a memory (256 by 12) 34, an output memory register 36, and a further register 38. A second portion of the memory structure, shown at 40, includes an input memory register 42, a memory 44 and an output memory register 46. A gating network 50, comprising a set of gates 52 for memory unit 30 and gates 54 for memory unit 40, is provided to transfer the data from the memory to a bus 53 used to convey the data both to register 26 and to inverters 22. The gating circuit is shown as comprising NAND gates enabled by particular signals, as disclosed infra. However, depending on the type of logic contemplated (positive or negative) and other considerations, the gating may be accomplished by other means, or other gates, or different arrangements. Moreover, registers 38 and 46 may be output gates themselves, and thus may not require any separate gating network. As is apparent to those skilled in the art, the memory may be segmented to more than two portions, and various delays analogous to register 38 may be introduced into the various portions, to further increase operating speed. This may be particularly desired in designs wherein adder 12 is substantially faster than memory operations.

In operation, alternate output words from adder 12 are stored in memory portions 30 and 40. Specifically, a first output word is directed to memory register 32, and a second output work is directed to memory register 42. While the same wiring connections are made to both registers, the registers are made receptive to the alternate words under the control of separate clock signals shown at leads 56 and 58. The various clock signals shown in the figure are generated by a control unit 59, providing a multi-phase sequence of clock signals as appreciated by those skilled in the art. Clock signals are also provided to registers 24 and 26 by unit 59. Specifically, when the clock signal on lead 56 undergoes a positive transition, memory register 32 receives the output of adder 12. When signal 58 undergoes a positive transition, memory register 42 receives the adder output. The contents of both registers 32 and 42 are then gated to memory units 34 and 44 under control of signals shown at leads 60 and 62. The address into which the signals are written is determined by an address generator 64. The two (256 by 12) memory sections 34 and 44, shown separately, may, as known to those skilled in the art, be considered as a single 256 by 24 memory unit. The output signals from the memory storage units are provided to memory output registers 36 and 46 under control of the signal on lead 56. The signal causes the data to be transferred to the registers simultaneously with the reading of the next word into memory register 32. Clearly, however, the reading of the data into register 32 need not necessarily be synchronized with the writing into output registers 36 and 46 and is done so primarily for convenience. The reading and writing need merely to be interleaved with each other.

Upon storage in registers 36 and 46, the signal on lead 58 causes a second output register 38 to store the data from register 36 while the data from register 46 is transmitted through AND gate 54 to the data bus, the gate being enabled by the signal on lead 58. Upon transmission of the data from register 46, the subsequent enablement of gate 52 by the signal on lead 56 causes the data stored in register 38 to be passed to the data bus. It is noted that as long as the various signals described herein occur with an interleaving frequency, the device will function as required. It is not necessary to provide the same identical signals to each of the blocks shown receiving identical signals, so long as the provided signals maintain the relationships described in the preceding section.

Because of the judicious choice of component timing described supra, the timing signals required in the memory transfer portion may be generated by a two-phase clock rather than a multi-phase clock as is appreciated by those skilled in the art. It is of interest to note that address generators such as 64 are capable of providing consecutive addresses for the data words, so that given a preset starting address upon pulse transmission, for example, the return data will correspond to the return pulse and succeeding return pulses will be stored consecutively.

As a result of the operation hereinabove described, output signals on bus 53, for example, provide fully digitally converted representations of the input signals at 4. Moreover, in memory units 34 and 44 are stored the digital versions of the most recently available input data. System outputs may be taken directly from the memory, to obtain data representative of any point of particular interest, and not necessarily of the presently scanned point. Further, because only the changing signal components are converted by ADC 8, the output thereof does not contain any of the static components of the signal. Thus, in the presently contemplated radar application, clutter-free signals are provided.

FIG. 5 provides a divider 70 between the ADC 8 and ADDER 12 of FIG. 1. The divider essentially shifts the ADC output, thereby dropping the least significant bits thereof. Lines 72 convey the dropped bits to storage 14 for direct appendage to the data therein prior to providing an output. Storage 14, of course, now uses fewer bits to store data point representations than is required by the system of FIG. 1. Moreover, the addition performed in unit 12 is on operands having shorter lengths and is thus more quickly accomplished than the longer addition required in FIG. 1. The output of storage 14, however, remains at a high accuracy because of the appendage of the least significant bits to its output data.

We wish it to be understood that we do not desire to be limited to the exact details of constructions shown and described, for obvious modifications can be made by a person skilled in the art.

We claim:

1. Apparatus for conversion of a present analog radar signal to a K-bit digital form, comprising:
   (a) first means receiving said analog radar signal for generating a signal repesenting a change from a previous point in time in said analog radar signal,
   (b) said first means having digital-to-analog conversion means therein,
   (c) second means connected to said first means and receiving the signal generated thereby for converting said signal generated by said first means to an N-bit digital signal representing said change in said analog radar signal where N is less than K,
   (d) adder means receiving a K-bit digital signal representing a previous point in time and said N-bit digital signal for adding said N-bit digital signal to said K-bit digital signal and for providing an updated K-bit digital output signal representative of said current analog radar signal,
   (e) register means connected to provide an input to said adder means,
   (f) storage means having an input and an output for storing a plurality of radar signals and being updated by said adder providing N-bit corrections to the data stored therein,
     said storage means comprising first and second storage devices for alternately receiving data from said adder means and for alternately providing storage data to said digital-to-analog converter and to said register means,
   (g) said adder means having:
     a first input connected to said second means, a second input connected to an output of said register means, and an output connected to said storage means input.

2. The subject matter set forth in claim 1 together with address generating means connected to the first and second storage means for controlling the address location within each storage means which is to store an updated K-bit digital signal, the address generating means permitting recall of a K-bit digital signal at a time subsequent to its storage.

* * * * *

UNITED STATES PATENT AND TRADEMARK OFFICE
CERTIFICATE OF CORRECTION

PATENT NO. : 4,204,198
DATED : May 20, 1980
INVENTOR(S) : Andree N. Filipov, Richard N. Johnson, Christopher H. Winslow It is certified that error appears in the above—identified patent and that said Letters Patent is hereby corrected as shown below:

In the title page, first column, item [75], "Christopher N. Winslow" should read as --Christopher H. Winslow--.

Signed and Sealed this

Twenty-fourth Day of February 1981

[SEAL]

Attest:

RENE D. TEGTMEYER

Attesting Officer

Acting Commissioner of Patents and Trademarks